United States Patent
Ouvrier-Buffet et al.

(10) Patent No.: US 6,861,719 B2
(45) Date of Patent: Mar. 1, 2005

(54) DEVICE FOR DETECTING THREE-DIMENSIONAL ELECTROMAGNETIC RADIATION AND METHOD FOR MAKING SAME

(75) Inventors: Jean-Louis Ouvrier-Buffet, Sevrier (FR); Sylvette Bisotto, Grenoble (FR); Stéphane Caplet, Sassenage (FR)

(73) Assignee: Commissariat a l'Energie Atomique, Paris (FR)

( * ) Notice: Subject to any disclaimer, the term of this patent is extended or adjusted under 35 U.S.C. 154(b) by 38 days.

(21) Appl. No.: 10/399,866
(22) PCT Filed: Nov. 6, 2001
(86) PCT No.: PCT/FR01/03422
§ 371 (c)(1),
(2), (4) Date: Apr. 29, 2003
(87) PCT Pub. No.: WO02/39481
PCT Pub. Date: May 16, 2002

(65) Prior Publication Data
US 2004/0092041 A1 May 13, 2004

(30) Foreign Application Priority Data
Nov. 7, 2000 (FR) .............................. 00 14247

(51) Int. Cl.⁷ .............................................. H01L 21/00
(52) U.S. Cl. ........................ 257/428; 257/433; 257/434; 257/680

(58) Field of Search ................................ 257/428–470, 257/680–686

(56) References Cited

U.S. PATENT DOCUMENTS 5,288,649 A * 2/1994 Keenan ...................... 438/54

FOREIGN PATENT DOCUMENTS

| JP | 09 264784 | 10/1997 |
| JP | 11 145489 | 5/1999 |
| JP | 2000 298063 | 10/2000 |
| WO | 95 17014 | 6/1995 |
| WO | 99 67818 | 12/1999 |

* cited by examiner

*Primary Examiner*—H. Jey Tsai
(74) *Attorney, Agent, or Firm*—Oblon, Spivak, McClelland, Maier & Neustadt, P.C.

(57) ABSTRACT

A device for detecting electromagnetic radiation including at least one detection circuit including a non-cooled thermal detector and an associated reading circuit, and a method for producing the device. The device includes a substrate forming a cavity under vacuum, in which are placed the thermal detector and the reading circuit. A window transparent to radiation is placed above the cavity and ensures the sealing of the cavity. A sealing mechanism hermetically attaches the window on the substrate, and an electrical connection is inserted in the window ensuring a leaktight connection between the detection circuit and processing elements outside the cavity.

6 Claims, 3 Drawing Sheets

DEVICE FOR DETECTING THREE-DIMENSIONAL ELECTROMAGNETIC RADIATION AND METHOD FOR MAKING SAME

FIELD OF THE INVENTION

The invention concerns a device for detecting electromagnetic radiation, such as infrared radiation, in which the detectors and the reading circuit are inserted in a cavity under vacuum, sealed by a window transparent to electromagnetic radiation, allowing leaktight electrical connections towards the exterior.

The invention also concerns a method for producing said device.

The invention concerns the field of thermal detectors and, in particular, non-cooled thermal infrared detectors. It may be used, for example, in monolithic infrared imagers operating at ambient temperature, and produced from a matrix of sensitive elements connected to a multiplexing system in CMOS or CCD type silicon.

STATE OF THE PRIOR ART

Non-cooled thermal detectors generally comprise a sensitive element that can be heated by infrared radiation in the band 8 to 12 $\mu$m, said sensitive element being characteristic of the temperature and the emissivity of the bodies observed. An increase in the temperature of the sensitive element leads to a variation in an electrical property of the sensitive material; said property may be, for example, the appearance of electrical charges by pyroelectric effect, or instead the variation in the capacitance by a change in the dielectric constant, or even the variation in the resistance when the material is a semi-conductor or metallic.

Three main conditions are necessary for said detectors to operate in an optimal manner. The sensitive material must have a low calorific mass, good thermal insulation of its active layer with respect to its support and a high sensitivity to the effect of converting the heating into an electrical signal, the first two conditions requiring the sensitive material to be produced as a thin layer.

In numerous applications, such as infrared imaging applications, thermal detectors must be conditioned under vacuum or under a gas not conductive to heat in order to improve performance. In this case, the thermal detectors are encapsulated in a housing comprising a window that is transparent in band III, in other words in the band from 8 to 12 $\mu$m. The classical operation for encapsulating in a housing is difficult, in terms of output, and relatively costly. To reduce the cost of said integration, collective encapsulation methods have been proposed.

One of said collective encapsulation methods is described in document WO-95/17014. This involves a collective encapsulation method under vacuum (or under a gas not conductive to heat) by coupling of a wafer of detectors with a wafer of windows transparent to infrared radiation. The connection between the two wafers is made via a weld bead that ensures, firstly, the leaktightness of the assembly and, secondly, allows the passage of the electrical connection between the interior and the exterior of the device. Said weld bead thus determines, as a function of its thickness, the spacing between the two components of the housing. The spacing may also be achieved by a spacer generated from layers deposited on the wafer of the device or the wafer of the window, or even directly produced in the material of the window. For components with large dimensions, a prop may be placed in the centre, in order to restrict deformation of the components with large dimensions.

The method described in said document proposes placing a metallic layer on the side of the wafer of detectors and on the side of the wafer of windows in order to ensure the wettability and the anchorage of the weld.

Furthermore, maintaining the vacuum within the micro-housing is ensured by employing materials that do not have an excessive degassing rate. However, even with a relatively low degassing rate, it is virtually obligatory to use a getter material to absorb the gases emitted by the different surfaces, because an increase in the pressure deteriorates the thermal insulation of the micro-bridges. Said getter material may be barium, vanadium, iron, zirconium or alloys thereof. However, before being active, said materials must be activated at high temperature, for a short period, either by Joule effect or by laser beam, without however the detector and the window being overly heated. In order to solve this problem, said getter material is deposited on micro-bridges reserved for this purpose, with the aim of confining the heating uniquely to the getter material.

In FIG. 1A, we have schematically represented said collective method for producing infrared detection devices.

Said FIG. 1A shows a detection wafer 2, a wafer of windows transparent to infrared radiation 3, and micro-bolometers, in other words non-cooled infrared detectors, referenced 4a, 4b and 4c. Said FIG. 1A also shows that the detection wafer 2 and the window wafer 3 are separated at regular intervals by spacers 5a, 5b, 5c, 5d, etc., which ensure the separation of the different detection components.

The assembly represented in FIG. 1A is the cut between two spacers, for example between 5b and 5c, in order to form different infrared detection devices.

Furthermore, an infrared detection device with a silicon window is described in patent application GB-A-2 310 952. Forming the window transparent to infrared radiation out of silicon has advantages, namely the low cost and good compatibility, in terms of dilation coefficient, with the detection circuit also formed on a silicon substrate. Moreover, the silicon makes it possible to obtain a good compromise between the mechanical properties and the electrical properties of the device.

In order to ensure the assembly of the window with the detection circuit, said document proposes either carrying out an eutectic sealing or a sealing by low melting point fritted glass, or by thermocompression welding. In the case of eutectic sealing, it is proposed using tin/lead alloys for the sealing, and a triple W/Ni/Au layer for the anchoring metallisations.

In FIG. 1B, we have schematically represented the above-mentioned infrared detection device, after cutting on the exterior of spacers 5c and 5d.

Said infrared detection device comprises a detection circuit comprising the detectors 4a and 4b and reading circuits, and a window transparent to infrared radiation 3. Said window 3 is maintained above the detection circuit 2 through two spacers 5c and 5d. This whole device is then attached to a support 6, to which it is connected through interconnecting wires 7.

This type of device requires sealing beads 5' on the detection circuit 2, which allow the passage of the electrical connection between the detection circuit 2 and the means of processing outside the device, after electrical insulation of said connections. However, the introduction of said beads in the manufacturing method is extremely tricky because it requires the presence of gold, which presents the risk of contaminating the CMOS circuit of the detection circuit 2.

Furthermore, said sealing bead increases the size of the detection circuit which constitutes the most costly element of the final device. The topology at the level of the sealing joint 5' must be considerably reduced, in other words it must be planarised, by mechanical/chemical polishing in order to ensure hermetic sealing.

Moreover, as explained above, it is necessary to use getters in said device in order to ensure a vacuum is maintained within the interior of the device, between the detection circuit 2 and the window 3. However, said getters are placed next to the infrared detectors, further increasing the surface of the detection circuit 2, to the detriment of the number of detection circuits per wafer.

SUMMARY OF THE INVENTION

The precise aim of the invention is to overcome the disadvantages of the device and the manufacturing method described previously. To this end, it proposes a device for detecting infrared radiation formed in three dimensions, in such a way as to transfer the part relating to the sealing on the elements considerably less expensive than the detection circuits and in such a way as to house the getter below the detection circuit.

More precisely, the invention concerns a device for detecting electromagnetic radiation comprising at least one non-cooled thermal detector and a reading circuit, characterised in that it comprises:

a substrate forming a cavity under vacuum, in which are placed the thermal detector and the reading circuit;

a window transparent to radiation, placed above the cavity and ensuring the sealing of said cavity;

sealing means for hermetically sealing the window on the substrate; and electrical connection means inserted in the window, ensuring a leaktight connection between the detection circuit and the processing elements outside the cavity.

Advantageously, the device comprises a getter placed in the cavity, below the reading circuit.

According to one embodiment of the invention, the connection means are metallised apertures.

According to another embodiment of the invention, the connection means are metal contact plates substantially in the form of an H and passing right through the window.

In yet another embodiment, the sealing means consists in an anodic sealing.

In a further embodiment, the sealing means consists in an eutectic sealing.

The invention also concerns a method for producing said device. More precisely, it involves a method for encapsulating non-cooled thermal detectors, combined with at least one reading circuit and intended to detect electromagnetic radiation. Said method is characterised by the fact that it consists in:

a) forming a cavity in a substrate;

b) forming apertures in a window transparent to the radiation to be detected and inserting, in a leaktight manner, electrical connection means in the apertures of the window;

c) connecting the detection circuit to the transparent window through the connection means; and d) placing the detection circuit in the cavity and hermetically sealing the transparent window on the substrate.

Advantageously, the method of the invention comprises a step c', which consists in placing a getter in the cavity, before putting in place the detection circuit.

Advantageously, an anti-reflection layer is deposited on either side of the transparent window.

According to one embodiment of the invention, the detectors are assembled on n reading circuits, where $n \geq 2$. In this case, the method of the invention consists in:

carrying out n times step a) in a wafer of substrate;

carrying out n times step b) in a wafer of transparent windows;

carrying out n times step c) in said wafer of windows;

carrying out step d) for each cavity; and cutting the assembly formed from the window wafer and the substrate wafer in order to obtain n detection devices conforming to the detection device of claim 1.

DETAILED DESCRIPTION OF EMBODIMENTS OF THE INVENTION

Figure 1A:
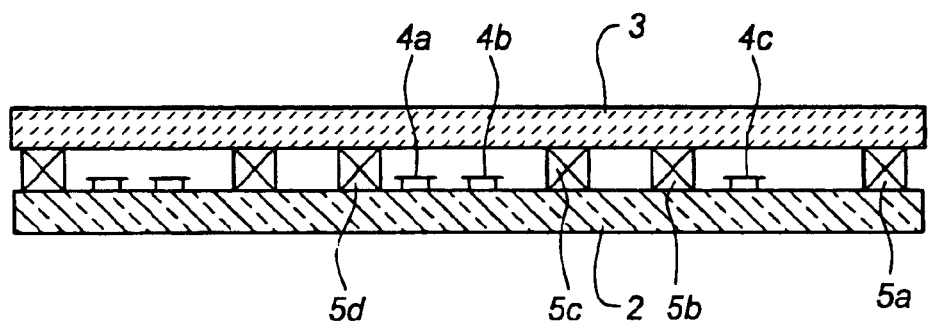
FIG. 1A, already described, schematically represents the general step of the method for collectively producing the device of the prior art.
Figure 1B:
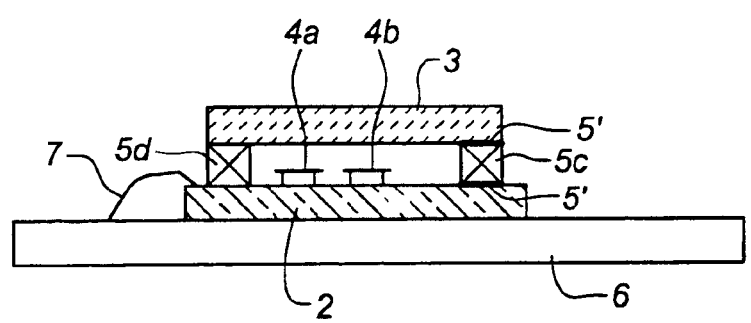
FIG. 1B represents the device of the prior art obtained by the method of FIG. 1A.
Figure 2:
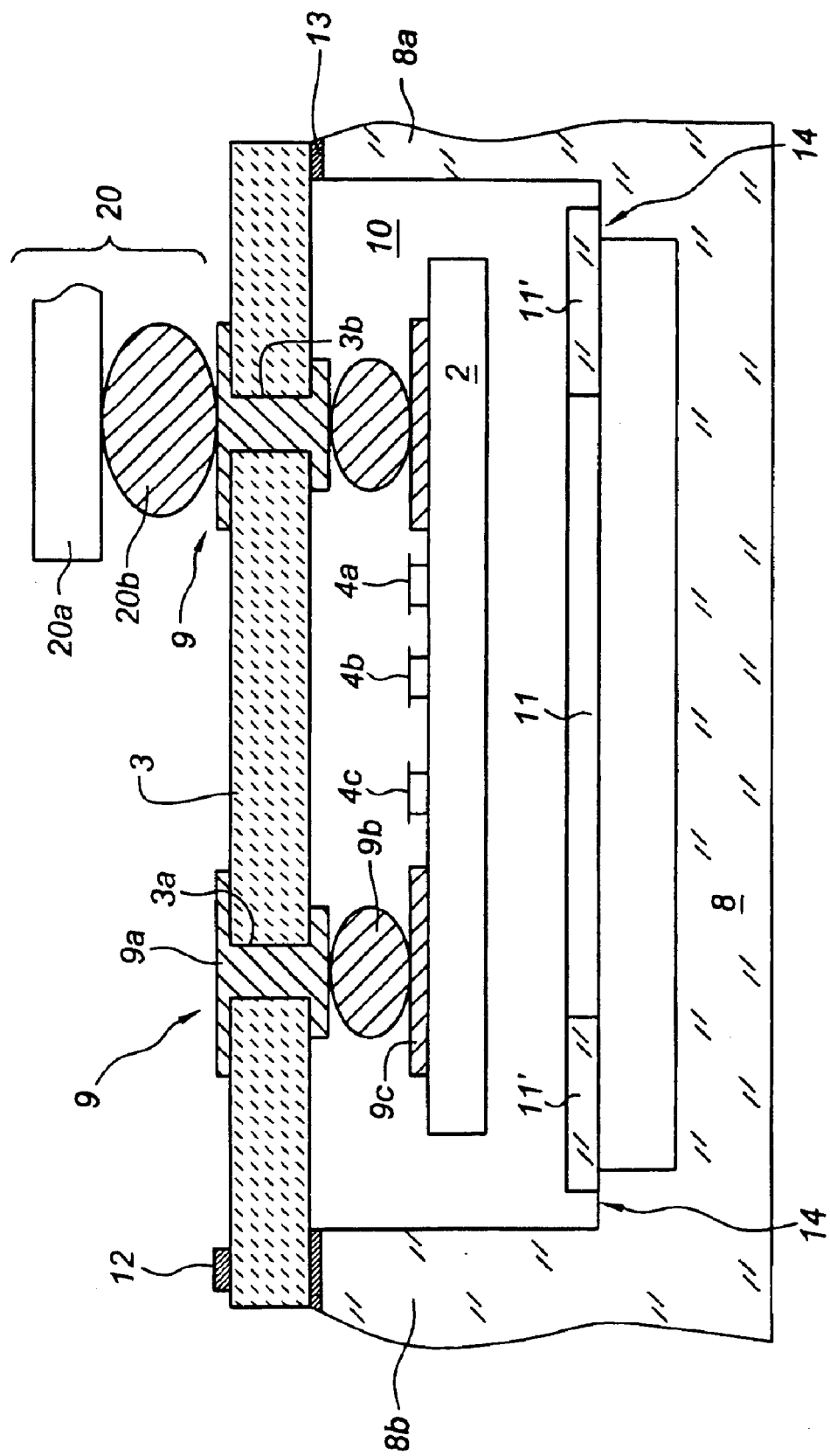
FIG. 2 represents the device for detecting infrared radiation of the invention.

In FIG. 2, we have schematically represented the device for detecting infrared radiation according to the invention. The references shown in FIG. 2, which are similar to those given in FIGS. 1A and 1B, represent identical elements.

The device of the invention is in the form of a stack of elements in three dimensions. One of said elements is a detection circuit 2, which comprises a reading circuit and three non-cooled infrared detectors 4a, 4b and 4c, which are also called "micro-bridges" and which are connected to the reading circuit. The number of detectors may be high (for example, 256×256).

When the detection device is applied to infrared imaging, each micro-bridge represents a pixel of the detected image.

The detection circuit 2 is placed within the interior of a substrate 8 hollowed out in such a way as to form a cavity 10.

Another element of the stacking 3D is a window transparent to infrared radiation, referenced 3, and placed above the cavity 10, in such a way as to ensure the sealing of the cavity 10. Said transparent window 3 rests on the walls 8a and 8b of the cavity 10. It is attached to said walls by sealing, for example anodic type sealing, as represented by reference 12 in FIG. 2. Said window 3 may also be attached to the walls of the cavity 10 by an eutectic type sealing, as represented by reference 13. It will be understood, obviously, that when producing such a device, one carries out the sealing of the window on the substrate 8 (in other words on the walls 8a and 8b of the cavity 10) by a same type of sealing, namely an anodic sealing or an eutectic sealing.

The transparent window 3 is pierced by several apertures that allow the passage of the means of connection between the exterior of the device and the interior of the cavity.

In the embodiment in FIG. 2, the window transparent to infrared radiation comprises two apertures, referenced 3a and 3b, allowing the passage of the means of connection 9 through the window 3. The apertures may be metallised by a screen printing process or by thermal decomposition (LPCVD method). Preferably, the thickness of said metallised layers is between 0.5 μm and 5 μm.

The means of connection 9 ensure that the detection circuit 2 is maintained within the interior of the cavity 10. As a result, they ensure the positioning of the infrared detectors 4a, 4b and 4c in relation to the window. Said means of connection 9 allow, moreover, the leaktight passage of a leaktight electrical connection between the detection circuit 2 contained in the cavity 10 and the means of processing 20 outside the device. Said external means of electronic processing 20 may be, for example, an electronic board 20a connected, through the welding contacts 20b, to one or several means of connection 9 of the detection device.

The means of electrical connection 9 may be of different types. Nevertheless, it is necessary for said means of connection to be sufficiently rigid to allow the mechanical attachment of the detection circuit 2, in order to ensure a stable position of said circuit within the interior of the cavity and for it to be leaktight in order to ensure a vacuum is maintained within the cavity 10. It should be noted that, throughout the description and in the claims, we will talk about the "cavity under vacuum", it being understood that it can also involve a gas with low heat conductivity.

Said means of connection 9 may, for example, consist in metal contacts 9a having a substantially reversed H form and passing right through the window (they will be called, in the following description, metal contacts in H). But any technique using metallised holes totally or partially filled are also suitable.

Said means of connection also comprise metallic connection contacts 9c, attached to the detection circuit 2 (called flat metallic contacts). Hybridisation contacts, referenced 9b, ensure the mechanical connection and the electrical connection between the metal contacts in H 9a and the flat metallic contacts 9c. Said contacts 9a, 9b and 9c are made out of metal materials, such as Ti, TiN, Pt, Al, Au, W, Ni, Ln, Sn, MnPb, SnPb, etc. They are deposited on the device by cathodic sputtering, CVD or by evaporation method.

The device of the invention has the advantage of comprising a sufficiently deep cavity to make it possible to install a getter within the interior of the device, under the detection circuit 2. In FIG. 2, we have represented a getter 11, placed on a getter support 11', if necessary thermally insulating, resting on recesses 14 formed in the walls 8a and 8b of the cavity. The getter thus placed below the reading circuit 2, makes it possible to save considerable space compared to classical devices in which the getter is placed beside the reading circuit. The getter may thus have large dimensions and thus may be used as a micropump, in other words it may partially replace a secondary pumping device, in general on the exterior of the assembly that needs to be pumped.

Furthermore, this positioning of the getter, opposite the rear face of the reading circuit 2, avoids the risks of alteration of the detectors 4a, 4b and 4c during the sealing, since the getter is not in direct contact with the detection circuit.

In the device of the invention, the sealing of window 3 on the substrate 8 may be an anodic sealing; this implies the use of PYREX® type glass (borosilicate), heavily doped with sodium or potassium. The assembly to be encapsulated is then placed under vacuum at a temperature typically between 100 and 500° C., and in the presence of a strong electric field, of around $7 \times 10^6$ V/m in the glass. The duration of the operation may reach around 30 minutes. However, under the combined effect of the electrical field and the temperature, the ions migrate towards the anode and the cathode, where they are trapped. The ions, thus accumulated, create a strong internal electrical field, which ensures the adhesion of the two materials present. Nevertheless, it is known that CMOS circuits (as is the case for the reading circuit) are sensitive to the diffusion of such metal ions and to the strong electrical field. But, in the invention, the detection circuit 2 is "suspended" in the cavity through the means of connection 2; the anodic sealing is therefore made between the window 3 and the walls 8a and 8b of the cavity 10, without risk of touching the detection circuit 2. Thus, the electrical field required for the sealing is confined to the exterior of the detection circuit; it therefore does not risk being degraded.

In the device of the invention, it is also possible to seal the window 3 on the substrate 8 by an eutectic sealing. This type of sealing consists in introducing a metallic layer, for example gold, between two silicon surfaces, in other words a layer of gold 13 between the window and the walls of the cavity, then heating the whole assembly. The melting temperature of the mixture that is formed by diffusion is lower than that of the metal or silicon. Thus, the gold reacts with the silicon at 363° C. to form the eutectic AuSi.

In the device of the invention, the detection circuit is never directly in contact with the metal, for example gold, used for the sealing. There is therefore no risk of contamination of the detection circuit by the gold.

Moreover, in said device, there is no relief arising from metallisation, in other words metallic contacts crossing through the sealing bead towards the exterior. The eutectic sealing may thus be carried out without any problem between the window and the walls of the cavity.

The sealing of the window on the walls of the cavity may also be formed from low melting point glass or even adhesives or by adding brazing alloy.

In order to form the device of the invention, it is necessary to activate the getter, which consists in heating it. The heating may be carried out by circulating an electrical current or even by heating the substrate/window assembly, or advantageously by laser. Said laser activation is carried out through the substrate which must be transparent around the wavelength that the laser operates. The use of a scanning laser makes it possible to activate the maximum surface of the getter 11, while at the same time avoiding overly heating the thermal detectors. In this respect, the rear face of the detection circuit may be equipped with a layer that reflects the infrared light emitted by the getter when it is activated. The support 11' of the getter is then made out of a thermally insulating material. Said laser activation process makes it possible to reach a temperature higher than 500° C. and, thus, to obtain an activation period of only several minutes.

The activation may also be achieved by radio frequency. In this case, the material constituting the getter 11 or its support 11' may be metallic. One then carries out a heating by induction from the rear face of the substrate forming the cavity. Thus, an electromagnetic wave provokes the circulation of induced currents, which lead to, in their turn, losses by Joule effect due to the eddy current. In order not to degrade the detection circuit during the activation phase, the thickness of the getter and/or its support must be adapted in such a way as to achieve an efficient shielding. As for laser activation, the rear face of the detection circuit may comprise a reflective layer, preferably non-conductive to electricity.

Figure 3:
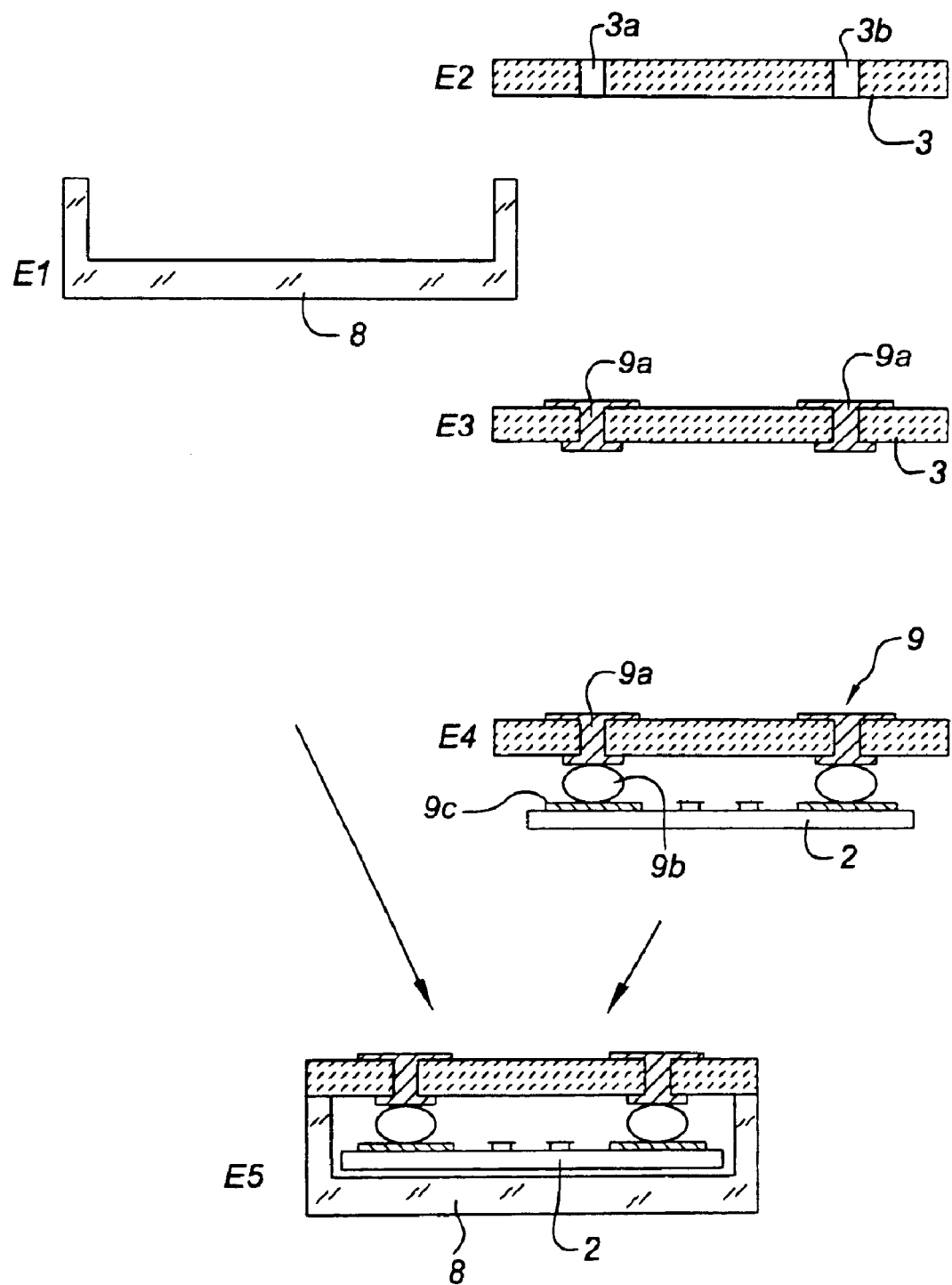
FIG. 3 schematically represents the different steps for producing the device of FIG. 2.

The device of the invention, as described previously, may be formed by means of a method called "encapsulation of non-cooled thermal detectors". As shown in FIG. 3, said method consists, firstly, in forming a cavity 10 in a substrate 8 (step E1), said substrate being, for example, in silicon or in glass. It then consists (step E2) in forming apertures 3a and 3b in a window transparent to infrared radiation; said window may be, for example, in silicon, in germanium or even in ZnS. Its thickness depends on its nature and the format of the detectors. It is between, preferably, 100 µm and 2 mm.

Means of connection 9 are then inserted into the apertures of the window (step E3), in such a way as to allow a leaktight connection.

Then, the detection circuit 2 is connected to the transparent window 3 through the means of connection 9 (step E4). The detection circuit thus attached to the window 3 is then inserted into the cavity 10 (step E5). The transparent window 3 is hermetically sealed on the walls 8a and 8b of the substrate.

In the preferred embodiment of the invention, the method consists in placing a getter 11 in the cavity, for example resting on recesses 14 formed in the cavity, and this is done before putting in place the reading circuit. The getter may also be formed directly in the substrate when said substrate is made to form the cavity.

An additional step makes it possible to form an anti-reflection layer on the window, by depositing an anti-reflection layer on either side of the transparent window.

The detector of the invention may also be formed in a collective manner. Several devices may then be produced simultaneously. In this case, it is necessary to have formed beforehand:

a detection wafer (detection circuits) on which is connected a plurality of non-cooled infrared detectors and their reading circuit;

a wafer of infrared windows made out of Si, Ge or ZnS, with connections towards the exterior;

a wafer of substrate with cavities and getters.

The wafer of windows and the wafer of substrates have been formed beforehand, in a separate manner, using classical micro-electronic techniques. In other words, the cavities in the wafer of substrates and the apertures in the wafer of windows are produced by chemical etching or plasma etching methods.

Thus, when the wafer of windows or the wafer of substrates have been formed, one hybridises the detection wafer onto the window wafer, which has been given an anti-reflection treatment beforehand. Then, the components of the detection wafer are separated by classic means for cutting integrated circuits on wafers. The collective production method then consists in placing getters within the interior of the cavities and hermetically sealing the wafer of windows on which is attached the detection wafer with the substrate wafer. Said sealing may be carried out according to any of the previously described methods.

One then carries out the cutting of the assembly, in a single operation. The activation of the getter may be carried before or after cutting, in such a way that at the end of the activation phase, the residual pressure in the cavity is less than 10 mTorr ($=10^{-2}$ mbar).

According to one embodiment, it is possible, in order to increase the number of detection circuits per wafer of substrate, to cut the wafer of detection circuits and to collectively connect the detection circuits thus obtained to the window wafer and only then to place and then to seal the assembly on the substrate wafer.

What is claimed is:

1. Device for detecting electromagnetic radiation including at least one detection circuit including a non-cooled thermal detector and an associated reading circuit, comprising:

a substrate forming a cavity under vacuum, the thermal detector and the reading circuit being placed in the cavity;

a window transparent to radiation, placed above the cavity and ensuring sealing of the cavity;

sealing means for hermetically sealing the window on the substrate; and electrical connection means inserted in the window, for ensuring a leaktight connection between the at least one detection circuit and processing elements outside the cavity.

2. Device according to claim 1, further comprising a getter placed in the cavity, below the reading circuit.

3. Device according to claim 1, wherein the electrical connection means include metallized apertures.

4. Device according to claim 1, wherein the electrical connection means include metallic contact plates, substantially in a form of an H, passing right through the window.

5. Device according to claim 1, wherein the sealing means includes an anodic sealing.

6. Device according to claim 1, wherein the sealing means includes an eutectic sealing.

* * * * *